(12) United States Patent
Ueyama et al.

(10) Patent No.: US 11,145,800 B2
(45) Date of Patent: Oct. 12, 2021

(54) MULTILAYER PYROELECTRIC ELEMENT

(71) Applicant: TAIYO YUDEN CO., LTD., Tokyo (JP)

(72) Inventors: Yuuhei Ueyama, Takasaki (JP); Hiroyuki Shimizu, Takasaki (JP); Yukihiro Konishi, Takasaki (JP)

(73) Assignee: TAIYO YUDEN., CO. LTD., Tokyo (JP)

( * ) Notice: Subject to any disclaimer, the term of this patent is extended or adjusted under 35 U.S.C. 154(b) by 0 days.

(21) Appl. No.: 16/637,195

(22) PCT Filed: Jul. 24, 2018

(86) PCT No.: PCT/JP2018/027620
§ 371 (c)(1),
(2) Date: Feb. 6, 2020

(87) PCT Pub. No.: WO2019/031223
PCT Pub. Date: Feb. 14, 2019

(65) Prior Publication Data
US 2020/0227616 A1  Jul. 16, 2020

(30) Foreign Application Priority Data

Aug. 10, 2017  (JP) .............................. JP2017-154936

(51) Int. Cl.
*H01L 37/02* (2006.01)
*G01J 5/02* (2006.01)
*G01J 5/34* (2006.01)

(52) U.S. Cl.
CPC ............ *H01L 37/02* (2013.01); *G01J 5/0285* (2013.01); *G01J 5/34* (2013.01)

(58) Field of Classification Search
CPC .................................... G01J 5/34; G01J 5/024
See application file for complete search history.

(56) References Cited

U.S. PATENT DOCUMENTS

| 4,627,138 A * | 12/1986 | Im ......................... H01L 37/02 |
| | | 264/104 |
| 6,121,615 A * | 9/2000 | Ito ............................. G01J 5/34 |
| | | 250/338.3 |

FOREIGN PATENT DOCUMENTS

| JP | H1082695 A | 3/1998 |
| JP | WO2011111099 A1 | 6/2013 |

(Continued)

OTHER PUBLICATIONS

International Search Report (ISR) dated Sep. 11, 2018, issued for International application No. PCT/JP2018/027620. (1 page).

(Continued)

*Primary Examiner* — Yara B Green
(74) *Attorney, Agent, or Firm* — Law Office of Katsuhiro Arai

(57) ABSTRACT

A multilayer pyroelectric element includes: a laminate body constituted by multiple pyroelectric body layers laminated in their thickness direction; internal electrode layers which are provided between the pyroelectric body layers, and one ends of which extend to the outer peripheries of the adjoining pyroelectric body layers; and external electrodes that connect the alternate internal electrode layers together at the one ends, wherein "$x_1 > x_3$ AND $x_2 > x_3$" are satisfied wherein $x_1$ is a distance between a pair of first faces crossing at right angles with the laminating direction of the pyroelectric body layers, $x_2$ is a distance between a pair of second faces crossing at right angles with the first faces and running parallel with the laminating direction of the pyroelectric body layers, and $x_3$ a is a distance between a pair of third faces crossing at right angles with the first faces and also with the second faces.

5 Claims, 2 Drawing Sheets

(56) References Cited

FOREIGN PATENT DOCUMENTS

| | | | |
|---|---|---|---|
| JP | 2013233001 A | 11/2013 |
| JP | 2014057399 A | 3/2014 |
| WO | 2011111099 A1 | 9/2011 |

OTHER PUBLICATIONS

Notification of Transmittal of Translation of the International Preliminary Report on Patentability (PCT/IB/338) dated Feb. 20, 2020, with International Preliminary Report on Patentability (PCT/IB/373) and Written Opinion of the International Searching Authority (PCT/ISA/237), for corresponding international application PCT/JP2018/027620, (6 pages).

A Notice of Reasons for Refusal issued by the Japanese Patent Office, dated Apr. 1, 2021, for Japanese counterpart application No. 2017-154936. (3 pages).

\* cited by examiner

[FIG. 1]
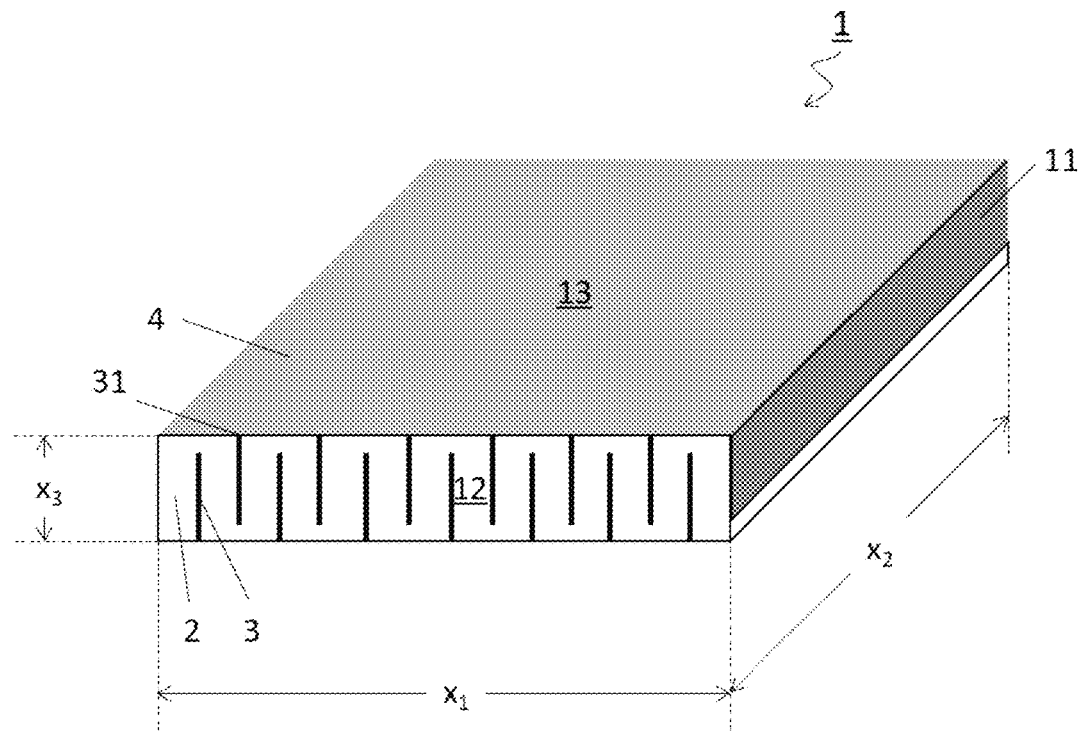
[FIG. 2]
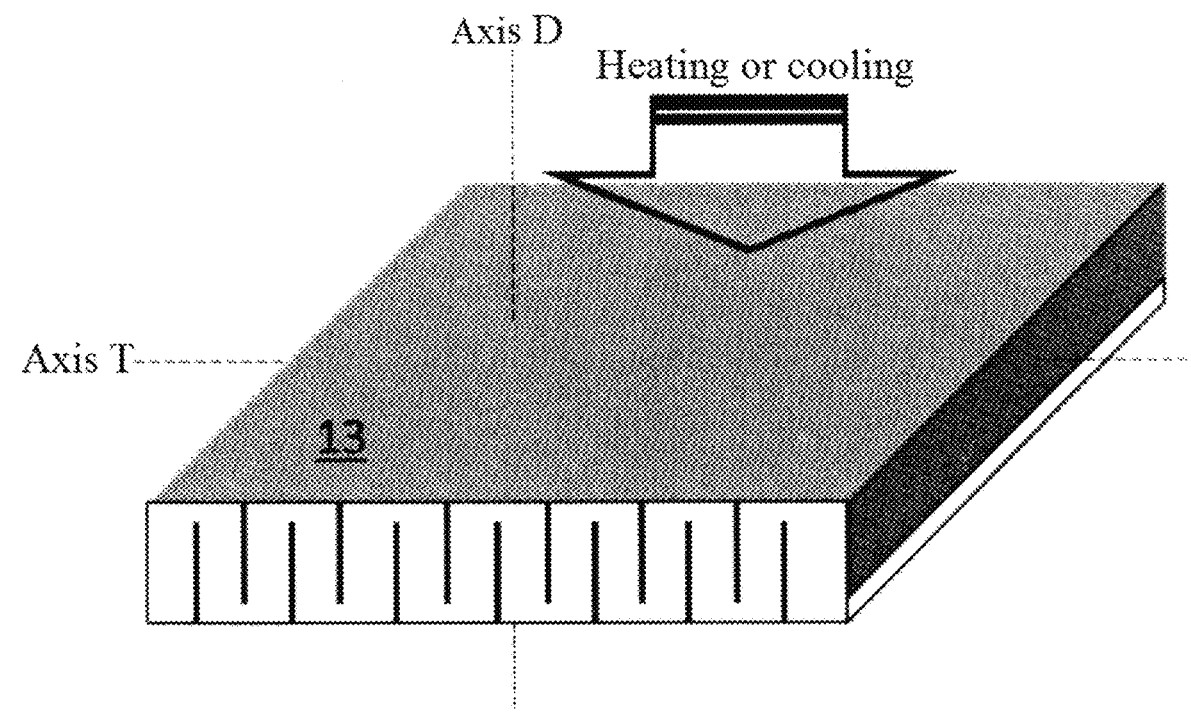

[FIG. 3]
Background Art
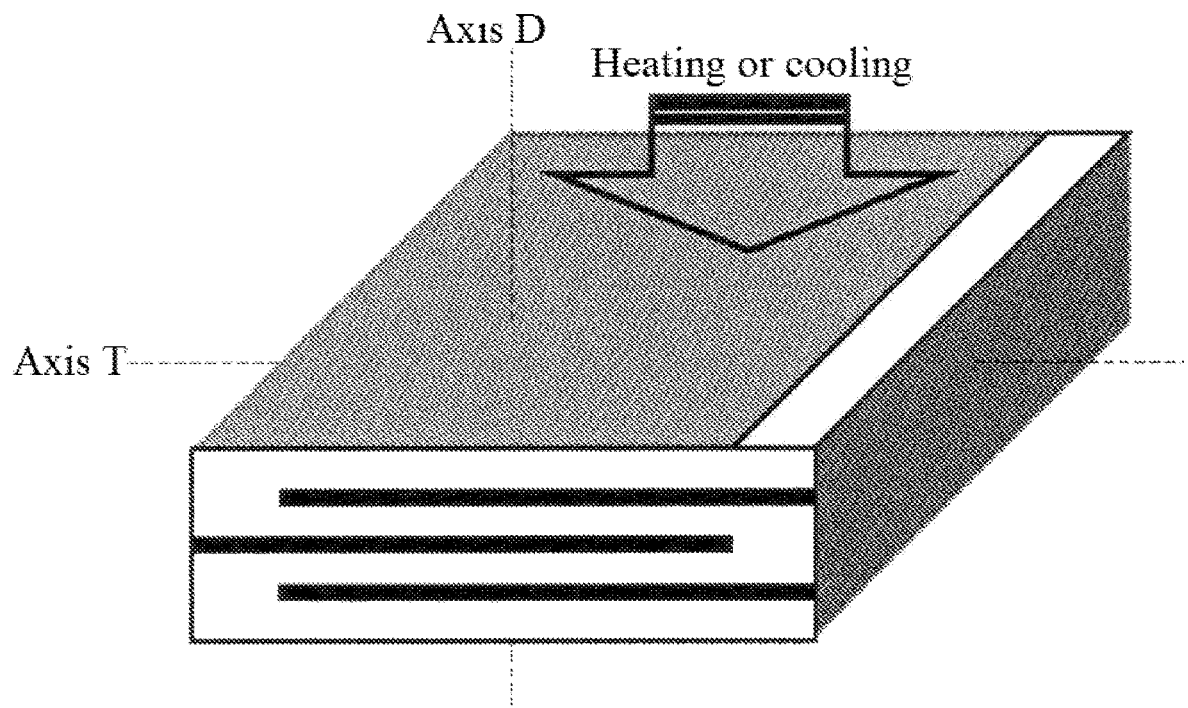
[FIG. 4]
Background Art
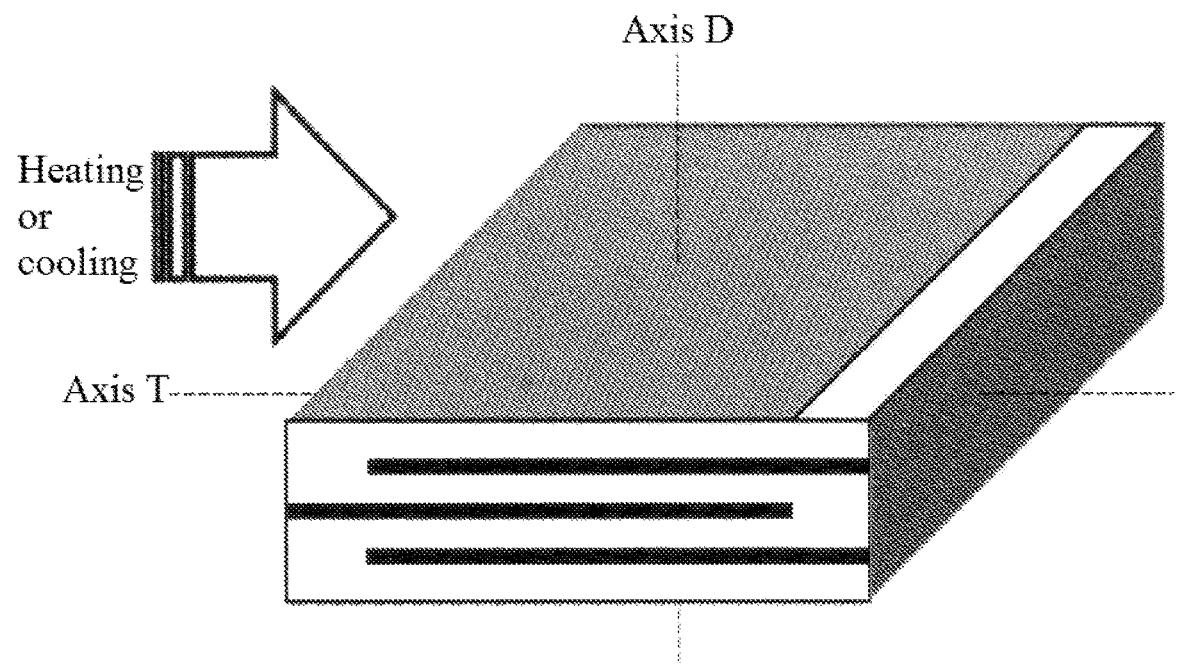

MULTILAYER PYROELECTRIC ELEMENT

CROSS-REFERENCE TO RELATED APPLICATIONS

This application is the U.S. National Phase under 35 U.S.C. § 371 of International Application PCT/JP2018/027620, filed Jul. 24, 2018, which claims priority to Japanese Patent Application No. JP2017-154936, filed Aug. 10, 2017. The International Application was published under PCT Article 21(2) in a language other than English.

TECHNICAL FIELD

The present invention relates to a multilayer pyroelectric element.

BACKGROUND ART

Pyroelectricity is a property to generate electric charge as a result of temperature change. Materials that have pyroelectricity (pyroelectric bodies) are utilized in power-generating devices and infrared sensors as pyroelectric elements that utilize electric charges (pyroelectric charges) generated by temperature change or detect potential differences resulting from charging.

Known pyroelectric elements include, for example, a power-generating element having electrodes formed on both sides of a thin porcelain sheet by means of Au deposition (Patent Literature 1). Also known is a pyroelectric body constituted by multiple pyroelectric elements (Patent Literature 2). Furthermore, an art of constituting a pyroelectric element using different materials that are arranged according to the directions of back-and-forth movement of a heat medium in a pyroelectric body in order to improve the thermoelectric conversion efficiency of the pyroelectric element, is also known (Patent Literature 2).

BACKGROUND ART LITERATURE

Patent Literature

Patent Literature 1: Japanese Patent Laid-open No. 2014-57399
Patent Literature 2: Japanese Patent Laid-open No. 2013-233001

SUMMARY OF THE INVENTION

Problems to be Solved by the Invention

It is desired that a pyroelectric element having electrodes formed at both ends of a pyroelectric body allows a greater amount of pyroelectric charge to be utilized (pyroelectric current), as this helps increase the generation output when the element is applied for a power-generating device, or improves sensitivity when the element is applied for an infrared sensor. The amount of pyroelectric charge that can be utilized (pyroelectric current), or $i_p$, is expressed by $i_p = Ap(dT/dt)$ Formula (1), where A represents the total electrode area in the pyroelectric element, p represents the pyroelectric coefficient, T represents temperature, and t represents time. This formula shows that, when an element is constituted using the same material based on the same electrode interval and placed under the same temperature conditions, the amount of pyroelectric charge that can be utilized will increase as the total electrode area in the element increases. Accordingly, the aim, in Patent Literature 2, of using a pyroelectric body constituted by multiple pyroelectric elements is understood as increasing the total electrode area, which equals the total sum of electrode areas in individual pyroelectric elements, thereby increasing the generation output beyond that of a single pyroelectric element.

Besides using multiple elements as mentioned above, use of a single element of laminate structure is also known as a means for increasing the total element electrode area. An element of laminate structure is an element constituted by layers having a desired property (such as pyroelectricity) and internal electrode layers, which are stacked alternately in such a way that the internal electrode layers are connected together alternately. By adopting a laminate structure, an element can be reduced in size compared to a single-layer element having the same total electrode area.

The conventionally used laminate structure presents the following concern: if it is adopted by a pyroelectric element and the element is heated or cooled from the outside in the laminating direction (refer to FIG. 3), a temperature gradient occurs in the laminating direction (direction of axis D) inside the pyroelectric body layers and consequently pyroelectric charge generates between each pair of an internal electrode having one polarity and an internal electrode having the other polarity, but in each of the adjoining pyroelectric body layers, the low-temperature-side and high-temperature-side relationship of the pair of internal electrodes having one polarity and the other polarity is reversed and therefore a reverse potential generates to cancel out the electromotive force; as a result, adequate pyroelectric charge consistent with the heating or cooling may not be utilized. Also, heating or cooling a pyroelectric element of the aforementioned structure in a direction crossing at right angles with the laminating direction (refer to FIG. 4) presents the following concern: due partly to low thermal conductivity of the pyroelectric body and partly to a relatively larger dimension of the element in the heating or cooling direction (direction of axis T), the temperature change at a position away from the heated or cooled location becomes smaller and therefore dT/dt in Formula (1) above decreases; as a result, the pyroelectric charge generated by the pyroelectric body at this location decreases and therefore adequate pyroelectric charge consistent with the element size may not be utilized.

Among the countermeasures to address the aforementioned problems is to form a pyroelectric element using materials of different Curie points that are arranged according to the temperature distribution generated inside the pyroelectric element, as described in Patent Literature 2; however, manufacturing an element whose material changes within the element is time-consuming.

Accordingly, an object of the present invention is to solve the aforementioned problems and provide a multilayer pyroelectric element that can cause a greater temperature change per unit of time (dT/dt).

Means for Solving the Problems

After conducting various studies to achieve the aforementioned object, the inventor of the present invention found that adjusting the element dimensions of a multilayer pyroelectric element could achieve the object, and eventually completed the present invention.

To be specific, an embodiment of the present invention to achieve the aforementioned object is a multilayer pyroelectric element comprising: a laminate body constituted by multiple pyroelectric body layers laminated in their thickness direction; internal electrode layers which are provided between the pyroelectric body layers of the laminate body, and one ends of which extend to the outer peripheries of the adjoining pyroelectric body layers; and external electrodes that connect the alternate internal electrode layers together at the one ends; wherein such multilayer pyroelectric element has: a pair of first faces crossing at right angles with the laminating direction of the pyroelectric body layers; a pair of second faces crossing at right angles with the first faces and running parallel with the laminating direction of the pyroelectric body layers; and a pair of third faces crossing at right angles with the first faces and also with the second faces; where, when the distance between the first faces is given by $x_1$, the distance between the second faces is given by $x_2$, and the distance between the third faces is given by $x_3$, then the relationships of $x_1 > x_3$ AND $x_2 > x_3$ are satisfied.

Additionally, a preferred mode in the aforementioned embodiment is the aforementioned multilayer pyroelectric element having a temperature gradient between the third faces. Furthermore, a more preferred mode in the aforementioned embodiment is a multilayer pyroelectric element where the external electrodes are formed on the opposing third faces, respectively, and also cover roughly the entire surfaces of the respective third faces, and, with respect to this multilayer pyroelectric element, a mode where the one ends of the internal electrode layers are exposed alternately on the opposing third faces and their exposed lengths are roughly equal to $x_2$ above, is even more preferred.

Effects of the Invention

According to the present invention, a multilayer pyroelectric element that can cause a greater temperature change per unit of time (dT/dt) can be provided.

BRIEF DESCRIPTION OF THE DRAWINGS

FIG. 1 A schematic view showing the structure of the multilayer pyroelectric element pertaining to an embodiment of the present invention FIG. 2 A schematic view showing a temperature distribution over the multilayer pyroelectric element pertaining to an embodiment of the present invention, resulting from heating or cooling the element FIG. 3 A schematic view showing a temperature distribution over a multilayer pyroelectric element having the conventional laminate structure, resulting from heating or cooling the element in the laminating direction FIG. 4 A schematic view showing a temperature distribution over a multilayer pyroelectric element having the conventional laminate structure, resulting from heating or cooling the element in a direction crossing at right angles with the laminating direction

MODE FOR CARRYING OUT THE INVENTION

The constitutions as well as operations and effects of the present invention, including the technical ideas, are explained below by referring to the drawings. It should be noted, however, that the mechanisms of operations include estimations and whether they are correct or wrong do not limit the present invention. Also, among the components in the embodiments below, those not described in the independent claims representing the most generic concepts are explained as optional components.

The structure of the multilayer pyroelectric element pertaining to an embodiment of the present invention (hereinafter referred to as "this embodiment") is shown schematically in FIG. 1. The multilayer pyroelectric element 1 pertaining to this embodiment comprises: multiple pyroelectric body layers 2 laminated in their thickness direction; internal electrode layers 3 which are provided between the pyroelectric body layers 2, and one ends 31 of which extend to the outer peripheries of the adjoining pyroelectric body layers; and external electrodes 4 that connect the alternate internal electrode layers 3 together at the one ends 31. Also, the multilayer pyroelectric element 1 pertaining to this embodiment has: a pair of first faces 11 crossing at right angles with the laminating direction of the pyroelectric body layers 2; a pair of second faces 12 crossing at right angles with the first faces and running parallel with the laminating direction of the pyroelectric body layers 2; and a pair of third faces 13 crossing at right angles with the first faces and also with the second faces. It should be noted that, while in FIG. 1 the end parts of the internal electrode layers 3 not connected to the external electrode 4 are depicted as being exposed on an end face of the multilayer pyroelectric element 1 for better clarification of the placement of the internal electrode layers 3, the present invention is not limited to this element shape and it also includes shapes where the end parts of the internal electrode layers 3 not connected to either external electrode remain unexposed on an end face of the element.

The pyroelectric material with which to constitute the pyroelectric body layer 2 is not limited in any way so long as it has pyroelectricity and is physically and chemically stable in the use environment of the element, and lead zirconate titanate (PZT), lead titanate (PbTiO$_3$), potassium niobate (KNbO$_3$), bismuth sodium titanate ((Bi,Na)TiO$_3$), or any solid solution, etc., produced by partially replacing the constitutive elements of the foregoing (such as Pb(Mg$_{1/3}$Nb$_{2/3}$)O$_3$—PbTiO$_3$) may be used. The thickness of the pyroelectric layer 2 is not limited in any way, either, and may be set as deemed appropriate in a manner suitable for the specification of the device in which the multilayer pyroelectric element 1 will be installed. As an example, it may be anywhere between 5 and 100 μm.

The electrode material with which to constitute the internal electrode layer 3 is not limited in any way so long as it is highly conductive and physically and chemically stable in the use environment of the multilayer pyroelectric element 1. If integral sintering of the pyroelectric body layers 2 and internal electrode layers 3 is adopted when manufacturing the multilayer pyroelectric element 1, it is also necessary that this material be physically and chemically stable at the sintering temperature and in the sintering atmosphere. Examples of electrode materials that can be used include silver (Ag), copper (Cu), gold (Au), platinum (Pt), palladium (Pd), nickel (Ni), as well as alloys, etc., made therefrom (such as silver palladium Ag/Pd).

The internal electrode layers 3 are such that one ends 31 thereof are exposed on either face of the multilayer pyroelectric element 1. Preferably the exposed one ends 31 are staggered by shifting the positions of alternate layers, in order to facilitate the connection of alternate layers by the external electrodes 4. The staggered one ends 31 may be placed on one face of the multilayer pyroelectric element 1, but preferably they are placed on different faces from the viewpoint of preventing short-circuiting between the electrodes of different polarities, and also from the viewpoint of maximizing the area of the external electrodes 4 as described below. The length of the exposed one ends 31 of the internal electrode layer 3 (length in the direction vertical to the laminating direction) is not limited in any way so long as connection to the external electrode 4 is possible; from the viewpoint of achieving a uniform temperature inside the multilayer pyroelectric element 1, however, preferably this length is increased to the maximum extent possible, or more preferably it is set roughly equal to the dimension of the face on which the one ends 31 are exposed. By increasing the length of the end parts 31, more of the heat applied from the outside of the element can be transferred to the inside of the element and consequently the temperature gradient inside the element can be reduced. In this Specification, "The length of the exposed one ends 31 of the internal electrode layer 3 is set roughly equal to the dimension of the face on which the one ends 31 are exposed" means only the spacing needed to prevent short-circuiting is provided from the edge of the face.

The electrode material with which to constitute the external electrode 4 is not limited in any way so long as it is highly conductive and physically and chemically stable in the use environment of the multilayer pyroelectric element 1. Examples of electrode materials that can be used include silver (Ag), copper (Cu), gold (Au), platinum (Pt), palladium (Pd), nickel (Ni), as well as alloys, etc., made therefrom (such as silver palladium Ag/Pd). The electrode material with which to constitute the external electrode 4 may be the same as, or different from, the electrode material with which to constitute the internal electrode layer 3.

The external electrode 4 is not limited in shape so long as it connects the one ends 31 of alternate internal electrode layer 3 exposed on an end face of the multilayer pyroelectric element 1, and it may be of a shape extending straight in the laminating direction, a meandering shape, a shape covering only a part of one face, or a shape covering roughly the entire surface of one face, of the multilayer pyroelectric element 1. From the viewpoint of achieving a uniform temperature inside the multilayer pyroelectric element 1, preferably the external electrode 4 has as large an area as possible, or more preferably it has a shape to cover roughly the entire surface of one face of the multilayer pyroelectric element 1. This is because, when an external electrode 4 of high thermal conductivity covers roughly the entire surface of one face of the multilayer pyroelectric element 1, the temperature distribution over the one face narrows, which in turn allows for narrowing of the temperature distribution at points inside the element that are equidistant from the one face. In this Specification, "An external electrode 4 covers roughly the entire surface of one face of the multilayer pyroelectric element 1" means only the spacing needed to prevent short-circuiting is provided from the edge of the face and also from the electrode of the different polarity.

Next, the dimensions of the multilayer pyroelectric element 1 pertaining to this embodiment are explained. The multilayer pyroelectric element 1 pertaining to this embodiment satisfies the relationships of $x_1 > x_3$ AND $x_2 > x_3$ when the distance between the first faces 11 is given by $x_1$, the distance between the second faces 12 is given by $x_2$, and the distance between the third faces 13 is given by $x_3$, as shown in FIG. 1. To reduce the temperature gradient in the element and obtain more pyroelectric charge, preferably $x_3$ is sufficiently small relative to $x_1$ and $x_2$. As an example, the ratios of $x_1$ and $x_2$ to $x_3$ are preferably $x_1/x_3 \geq 5$ and $x_2/x_3 \geq 5$, or more preferably $x_1/x_3 \geq 10$ and $x_2/x_3 \geq 10$. The specific value of each dimension may be set as deemed appropriate according to the specification of the device in which the element will be installed; as an example, $x_1$ and $x_2$ may be 20 to 100 mm, while $x_3$ may be 0.05 to 5 mm.

Preferably the multilayer pyroelectric element 1 pertaining to this embodiment has a temperature gradient between the third faces 13, as shown in FIG. 2. In this case, a temperature gradient in the laminating direction does not occur easily in the pyroelectric body layers 2 because the pyroelectric body layers 2 and internal electrode layers 3 are positioned in parallel with the direction of temperature change. Accordingly, a reverse potential does not generate easily between the adjoining pyroelectric body layers, which means that the electromotive force is not cancelled out and a large amount of pyroelectric charge can be utilized. Additionally, the element is smaller in dimension in the direction of temperature change than in other directions, which reduces the temperature gradient in the element in this direction and thus allows for utilization of the entire element in generating pyroelectric charge.

The multilayer pyroelectric element 1 pertaining to this embodiment is more preferably such that the external electrodes 4 are formed on a pair of opposing third faces 13, respectively, and also shaped in a manner covering roughly the entire surfaces of the respective third faces 13, or further preferably such that, besides the external electrodes 4 having such shape, the one ends 31 of the internal electrode layers 3 are exposed alternately on the opposing third faces 13 and also shaped so that their exposed lengths are roughly equal to $x_2$. When an external electrode 4 of high thermal conductivity covers roughly the entire surface of a third face 13, the in-plane temperature distribution tends to become uniform, which in turn allows for narrowing of the temperature distribution at points inside the element that are equidistant from the third face 13. Furthermore, increasing the exposed lengths of the internal electrode layers 3 and thereby increasing their contact area with the external electrode 4 increases the amount of heat transferred from the external electrode 4 to the internal electrode layers 3, and accordingly the amount of heat transferred from the internal electrode layers 3 to the pyroelectric body layers 2 also increases, and consequently the temperature change per unit of time (dT/dt) can be increased.

For the manufacture of the multilayer pyroelectric element 1 pertaining to this embodiment, any general method for manufacturing laminated elements may be adopted. As an example, the method of integrally sintering the pyroelectric body layers 2 and internal electrode layers 3 is explained below.

First, a pyroelectric material powder from which to form the pyroelectric body layers 2 is mixed with a binder, etc., to form a slurry or green body, which is then formed in sheet shape to obtain raw sheets of pyroelectric material. For the sheet forming method, the doctor blade method, extrusion molding method, or any other commonly used method may be adopted.

Next, electrode patterns which will become the internal electrode layers 3 after sintering, are formed on the raw sheets of pyroelectric material. The electrode patterns may be formed using any commonly used method, where a method of printing or applying a paste that contains electrode material is preferred in terms of cost. When forming electrode patterns by means of printing or application, glass frit or pyroelectric material powder may be mixed into the paste in order to improve its adhesive strength to the pyroelectric body layers 2 after sintering.

Next, the raw sheets of pyroelectric material on which the electrode patterns have been formed are stacked by a prescribed number, and then the sheets are bonded together to obtain a formed green sheet. The laminating and bonding may be performed using any commonly used methods, where a method of thermally compressing and bonding the raw sheets together through the action of the binder is preferred in terms of cost.

Next, the formed green sheet is sintered. The sintering temperature and atmosphere may be set as deemed appropriate according to the characteristics of the pyroelectric material and electrode material used. If multiple pyroelectric elements are to be obtained from one formed green sheet, the formed green sheet may be divided into several blocks prior to sintering.

After sintering, external electrodes 4 are each formed in a manner connecting the one ends 31 of internal electrodes layer 3 exposed on one face of the sintered body, to complete a multilayer pyroelectric element 1. The formation of external electrodes 4 may be performed using any commonly used method, and besides dip coating, vapor deposition may also be adopted.

INDUSTRIAL FIELD OF APPLICATION

According to the present invention, a multilayer pyroelectric element that can cause a greater temperature change per unit of time (dT/dt) can be provided. Since the amount of heat received can be used efficiently for causing temperature change, this pyroelectric element is useful in that it can form power-generating elements of large generation outputs or highly sensitive infrared sensors.

DESCRIPTION OF THE SYMBOLS

1 Multilayer pyroelectric element
11 First face
12 Second face
13 Third face
2 Pyroelectric body layer
3 Internal electrode layer
31 Exposed one ends of internal electrode layer
4 External electrode

What is claimed is:

1. A multilayer pyroelectric element comprising:
   a laminate body constituted by multiple pyroelectric body layers laminated in a thickness direction;
   internal electrode layers which are provided between the pyroelectric body layers of the laminate body, wherein one ends of the internal electrode layers extend to outer peripheries of adjoining pyroelectric body layers; and
   external electrodes that connect the alternate internal electrode layers together at the one ends;
   wherein said multilayer pyroelectric element has: a pair of first faces opposing to each other, a pair of second faces opposing to each other, and a pair of third faces opposing to each other, wherein each pair is provided on a plane intersecting planes on which the other pairs are provided, respectively, where, when a distance between the first faces is given by $x_1$, a distance between the second faces is given by $x_2$, and a distance between the third faces is given by $x_3$, then relationships of $$x_1/x_3 \geq 1 \text{ AND } x_2/x_3 \geq 1$$

are satisfied,
wherein each external electrode is provided on a roughly entire area of each third face running parallel with a laminating direction of the pyroelectric body layers.

2. The multilayer pyroelectric element according to claim 1, wherein a temperature gradient between the third faces is less than those between the first faces and between the second faces.

3. The multilayer pyroelectric element according to claim 1, wherein the one ends of the internal electrode layers are exposed alternately on the third faces and their exposed lengths are roughly equal to $x_2$ above.

4. The multilayer pyroelectric element according to claim 1, wherein relationships of $$x_1/x_3 \geq 5 \text{ AND } x_2/x_3 \geq 5$$

are satisfied.

5. The multilayer pyroelectric element according to claim 1, wherein relationships of $$x_1/x_3 \geq 10 \text{ AND } x_2/x_3 \geq 10$$

are satisfied.

* * * * *